US011796301B2

(12) United States Patent
Schneider et al.

(10) Patent No.: US 11,796,301 B2
(45) Date of Patent: Oct. 24, 2023

(54) SENSOR ELEMENT FOR STORING ROTATION OR POSITION INFORMATION

(71) Applicant: DR. JOHANNES HEIDENHAIN GmbH, Traunreut (DE)

(72) Inventors: Johannes Schneider, Traunstein (DE); Wolfgang Holzapfel, Obing (DE); Martin Heumann, Traunstein (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 608 days.

(21) Appl. No.: 17/083,327

(22) Filed: Oct. 29, 2020

(65) Prior Publication Data

US 2021/0156662 A1 May 27, 2021

(30) Foreign Application Priority Data

Nov. 27, 2019 (DE) ..................... 10 2019 218 351.4

(51) Int. Cl.

*G01B 7/30* (2006.01)
*G01B 7/02* (2006.01)
*G11C 19/08* (2006.01)
*G01D 5/14* (2006.01)
*G11C 21/00* (2006.01)
*G01D 5/56* (2006.01)
*B82Y 25/00* (2011.01)
*G01P 3/44* (2006.01)
*G01R 33/09* (2006.01)
*G01R 33/00* (2006.01)

(52) U.S. Cl.

CPC ............... *G01B 7/02* (2013.01); *G01D 5/145* (2013.01); *G01D 5/56* (2013.01); *G11C 19/0808* (2013.01); *G11C 21/00* (2013.01); *B82Y 25/00* (2013.01); *G01D 2205/26* (2021.05); *G01D 2205/90* (2021.05); *G01P 3/44* (2013.01); *G01R 33/0005* (2013.01); *G01R 33/091* (2013.01)

(58) Field of Classification Search

CPC .............................. G01B 7/30; G11C 19/0808
USPC .................................................. 33/1 PT, 534
See application file for complete search history.

(56) References Cited

U.S. PATENT DOCUMENTS 5,218,769 A * 6/1993 Tranchon ............. G01D 5/3473 33/1 PT
6,072,382 A * 6/2000 Daughton .............. H10N 50/10 338/32 R
6,437,323 B1 * 8/2002 Franz ................. G01D 5/34715 250/237 G
6,690,157 B2 * 2/2004 Kowalski ................. G01B 7/30 324/252
6,775,109 B2 * 8/2004 Gambino ............. G01R 33/093 360/324

(Continued)

FOREIGN PATENT DOCUMENTS

DE 102008037975 A1 3/2009
EP 1740909 B1 6/2007

*Primary Examiner* — George B Bennett
(74) *Attorney, Agent, or Firm* — LEYDIG, VOIT & MAYER, LTD.

(57) ABSTRACT

A sensor element for storing rotation or position information includes a substrate and a domain wall conductor arranged on the substrate. A course of the domain wall conductor is of a closed circumferential, continuous configuration without crossings. The domain wall conductor comprises a first region having a positive curvature and a second region having a negative curvature.

15 Claims, 14 Drawing Sheets

(56) References Cited

U.S. PATENT DOCUMENTS

| | | | | |
|---|---|---|---|---|
| 6,831,456 | B2 * | 12/2004 | Doescher | G01D 5/145<br>324/252 |
| 7,671,583 | B2 | 3/2010 | Diegel et al. | |
| 8,698,490 | B2 * | 4/2014 | Ausserlechner | G01D 5/145<br>324/207.21 |
| 9,312,057 | B2 * | 4/2016 | Martinek | H01F 41/0246 |
| 9,470,505 | B2 * | 10/2016 | Ely | G01B 7/30 |
| 10,415,952 | B2 * | 9/2019 | Reddy | G01B 7/30 |
| 10,690,515 | B2 * | 6/2020 | Deak | G01D 5/16 |
| 10,948,554 | B2 * | 3/2021 | Deak | G01R 33/0017 |
| 10,962,386 | B2 * | 3/2021 | Mattheis | G01D 5/24476 |
| 11,733,319 | B2 * | 8/2023 | Tonegawa | G01R 33/0052<br>324/309 |
| 2010/0301842 | A1 | 12/2010 | Mattheis | |
| 2018/0216965 | A1 | 8/2018 | Richard et al. | |
| 2018/0356252 | A1 | 12/2018 | Diegel et al. | |
| 2019/0195613 | A1 | 6/2019 | Zimmer et al. | |
| 2022/0308128 | A1 * | 9/2022 | Endo | H01F 10/132 |
| 2022/0381853 | A1 * | 12/2022 | Endo | G01R 33/0011 |

* cited by examiner

SENSOR ELEMENT FOR STORING ROTATION OR POSITION INFORMATION

CROSS-REFERENCE TO PRIOR APPLICATIONS

Priority is claimed to German Patent Application No. DE 10 2019 218 351.4, filed on Nov. 27, 2019, the entire disclosure of which is hereby incorporated by reference herein.

FIELD

The invention relates to a sensor element for storing rotation or position information, for example for an angle or length measuring device.

BACKGROUND

Angle measuring devices are used, for example, as rotary encoders for determining the angular position of two machine parts that are rotatable relative to each other. So-called multi-turn angle measuring devices are frequently used for this purpose, by means of which absolute position determination over many rotations is possible.

Furthermore, length measuring devices are known in which a linear displacement of two machine parts that are displaceable relative to each other is measured. In particular, in the case of length measuring devices with a comparatively large measurement length, multiple linear scales or identical scales are often lined up end to end. In the case of such length measuring devices, absolute position determination is to be possible, if at all possible over the entire measurement length.

Such measuring devices or measuring devices for electric drives are frequently used for determining the relative movement or the relative position of corresponding machine parts. In this case, the position values generated are supplied to a subsequent electronics system for driving the drives via a corresponding interface arrangement.

EP 1 740 909 B1 describes a sensor element for a revolution counter in which domain walls are formed, wherein the sensor element has a specific spiral shape.

SUMMARY

In an embodiment, the present invention provides a sensor element for storing rotation or position information. The sensor element includes a substrate and a domain wall conductor arranged on the substrate. A course of the domain wall conductor is of a closed circumferential, continuous configuration without crossings. The domain wall conductor comprises a first region having a positive curvature and a second region having a negative curvature.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

Figure 1:
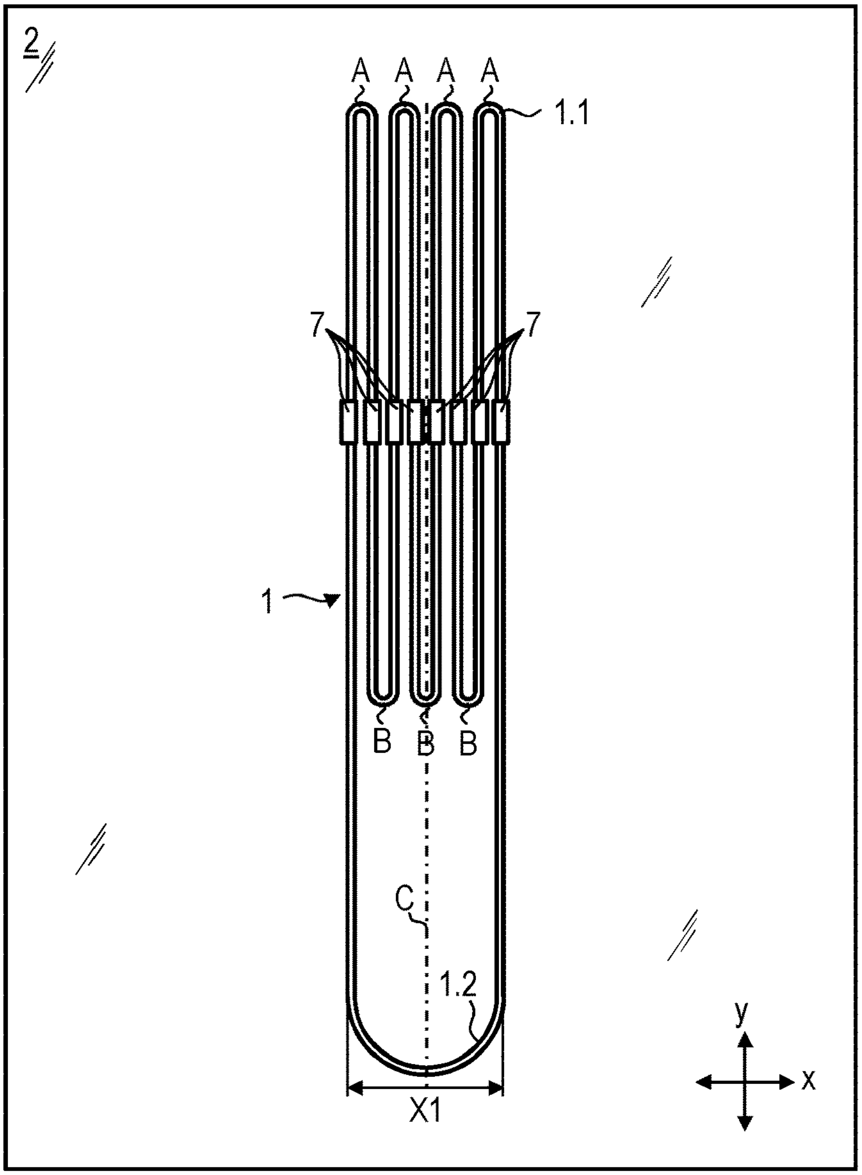
FIG. 1 a plan view of a sensor element.

In an embodiment, the present invention provides a sensor element or a storage system which comprises a domain wall conductor and which enables a robust operating performance in relation to external influences and can be produced comparatively economically.

The sensor element according to an embodiment of the present invention for the in particular active storage of rotation or position information comprises a domain wall conductor and a substrate, wherein the course of the domain wall conductor on the substrate is of a closed circumferential, continuous configuration without crossings. Furthermore, the domain wall conductor has at least one first region with a positive curvature and at least one second region with a negative curvature.

The term “active storage” is to be understood to mean a storage for which the relevant sensor element does not require any auxiliary electrical energy.

In the context of the present invention, domain wall conductors are in particular conductor tracks or conductor paths or nanowires consisting of a magnetizable material. Information can be stored in the domain wall conductors in the form of contrarily magnetized regions (domains). The domains are separated by so-called domain walls which can be displaced by magnetic fields, wherein the positions of the domains change. To determine their position, read-out elements are arranged, past which the domains or domain walls are pushed. Domain wall conductors considered from a functional perspective can therefore also be regarded as a type of shift register.

The course of the domain wall conductor forms a continuous curve and has neither a jump nor a peak, kink or any other point of discontinuity. The term “continuous curve” is therefore to be understood to mean a course of the domain wall conductor which is embodied uniformly without abrupt changes in direction. Expressed mathematically, the course of the domain wall conductor is thus continuous and in particular differentiable over its entire length, so that a unique tangent can thus be generated at each point on the course of the domain wall conductor.

The crossing-free course of the domain wall conductor is to be understood in particular to mean that the domain wall conductor does not cross in its course, but also in different layers does not cross over itself.

Curvature is to be understood to mean the change in direction along the course of the domain wall conductor on the in particular planar substrate. In the case of a straight course, the curvature is equal to zero because the direction of progression does not change. If the curvature is not equal to zero, the curvature, signed in accordance with an orientation of the normal bundle of the curve, can be defined for the course of the domain wall conductor. The curvature is positive when it curves toward the unit normal vector field and negative when it curves in the opposite direction. For example, the first region with the positive curvature may be referred to as a convex region, while the second region with the negative curvature may then be referred to as a concave region. Expressed mathematically, the course of the domain wall conductor thus has in particular at least one inflection point.

The sensor element advantageously comprises an in particular planar substrate and the domain wall conductor is configured as a conductor track on the substrate.

In an embodiment of the invention, the width of the domain wall conductor is less than 1000 nm, in particular less than 500 nm, advantageously less than 300 nm.

The thickness or layer thickness of the domain wall conductor is advantageously less than 200 nm, in particular less than 150 nm, in particular less than 60 nm.

The substrate advantageously has a glass layer and/or a silicon layer. In particular, when the substrate comprises a silicon layer, the sensor element may be constructed as a part of a CMOS chip.

In an advantageous embodiment, the sensor element furthermore has read-out elements by means of which (at the respective position of the read-out elements) the local magnetization state of the domain wall conductor can be determined. A magnetization state of the domain wall conductor can thus be determined in each case by the read-out elements. The read-out elements are arranged fixedly with respect to the domain wall conductor.

In an embodiment of the invention, the domain wall conductor is arranged in a layer between at least one of the read-out elements and the substrate. Alternatively or additionally, at least one of the read-out elements is arranged in a layer between the substrate and the domain wall conductor.

The read-out elements are advantageously designed as GMR or TMR sensors.

The sensor element may comprise a plurality of domain wall conductors. In this case, the plurality of domain wall conductors has different numbers of first regions or different numbers of second regions. Thus, for example, the sensor element can have a first domain wall conductor and a second domain wall conductor, wherein the first domain wall conductor has a first number of first regions and the second domain wall conductor has a second number of first regions.

Advantageously the different numbers, that is to say the number of the first regions of the first domain wall conductor and the number of the first regions of the second domain wall conductor, are coprime. As is generally known, the term coprime is understood to mean that apart from one there is no natural number that is a common divisor of the numbers in question (natural numbers).

In another embodiment, the invention also comprises a storage system with a sensor element and with a read-out element and also a magnet arrangement. The magnet arrangement is movable in a first direction relative to the domain wall conductor. This causes a displacement of magnetic domains or of domain walls.

The magnetic field generated by the magnet arrangement is advantageously configured asymmetrically with respect to an axis which runs parallel to the first direction. This consideration applies to any imaginary axis that runs parallel to the first direction.

In an embodiment of the invention, the magnetic field generated by the magnet arrangement is advantageously configured symmetrically with respect to an axis which runs parallel to a second direction. The second direction is oriented orthogonally to the first direction.

The axis which runs parallel to the first direction and the axis which runs parallel to a second direction lie in particular in a plane which is oriented parallel to the substrate.

In an embodiment of the storage system, the magnet arrangement is configured as a magnet array which has magnets whose poles are arranged offset from each other in the first direction.

Advantageously, two magnets offset relative to each other in the first direction have a pole orientation rotated by 180°. The magnets in question are thus arranged such that the connecting line between the north pole and the south pole of one magnet is parallel to the connecting line between the north pole and the south pole of the other magnet, wherein the pole orientation of the magnets is opposite. The offset magnets can therefore be referred to as being arranged antiparallel to each other with regard to the pole orientation.

In an embodiment of the storage system, the magnet array has magnets whose poles are arranged offset from each other in a second direction, wherein the second direction is oriented orthogonally with respect to the first direction.

Advantageously, two magnets offset relative to each other in the second direction and in particular adjacent magnets have a pole orientation rotated by 180°.

The profile of the domain wall conductor is advantageously configured axisymmetrically. In particular, the relevant axis of symmetry can run parallel to the second direction or in the second direction.

The domain wall conductor has an extension in the first direction and two magnetic poles have a center distance, wherein the extension is less than the center distance. To be understood in particular here is the maximum extension of the domain wall conductor in the first direction. The center distance can in particular be the distance between the effective centers of the magnets. For example, in the case of cylindrical rod magnets, the center distance can be seen as the distance between the longitudinal axes of the cylindrical rod magnets.

The storage system is designed in such a way that it has at least two domain walls, wherein developments with four or more domain walls can also be used.

FIG. 1 shows a sensor element comprising a domain wall conductor 1 and a substrate 2, wherein the domain wall conductor 1 is applied to the substrate 2 in the form of a conductor track. In the exemplary embodiment presented, the substrate 2 has a mechanically supporting glass layer, wherein the substrate 2 is of planar design. Alternatively, the substrate 2 may comprise a silicon layer, wherein the sensor element may then be configured as a part of a CMOS chip.

The domain wall conductor 1 comprises a soft magnetic material, for example an Ni—Fe alloy. The domain wall conductor 1 comprises a first section 1.1 in which the domain wall conductor 1 runs in comparatively narrow loops and a second section 1.2 in which the domain wall conductor 1 runs in an arc with a relatively large radius. The first section 1.1 and the second section 2.2 adjoin one another directly, so that the course of the domain wall conductor 1 is configured to be closed circumferentially. The domain wall conductor 1 has a width X1 in a first direction x and is configured symmetrically with respect to an axis C which is oriented perpendicular to the first direction x and parallel to a second direction y. In the exemplary embodiment presented, the width X1 is 70 μm, wherein the domain wall conductor 1 extends over 5 mm in the second direction y.

Figure 2:
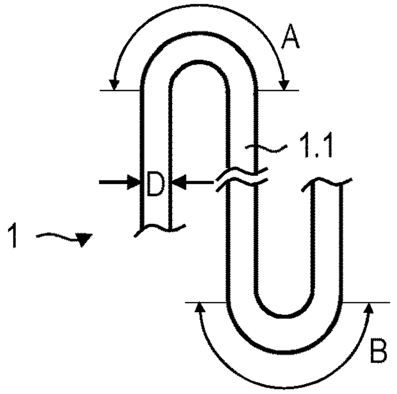
FIG. 2 a detailed view of a domain wall conductor.

A detail of the domain wall conductor 1 is shown in FIG. 2. It can clearly be seen therein that the domain wall conductor 1 has in its course a first region A with a positive curvature and a second region B with a negative curvature. In other words, if one were to follow the course of the domain wall conductor 1, one would encounter both a section with a right curvature and a section with a left curvature. In the course of the first section 1.1, a second region B with a negative curvature follows a first region A with a positive curvature and then once again a first region A etc., wherein in the exemplary embodiment presented regions with a straight course of the domain wall conductor 1 are located between the first regions A and the second regions B. In the second section 1.2, the sign of the curvature does not change. In the exemplary embodiment presented, the curvature or the radius of curvature is shown as constant.

According to FIG. 1, in a layer above the domain wall conductor 1 read-out elements 7 are located, which can be GMR sensors or TMR sensors, for example, with the aid of which the magnetization state of the domain wall conductor 1 subjacent thereto can be determined. Alternatively, the read-out elements 7 can also be arranged between the domain wall conductor 1 and the substrate 2.

Figure 3:
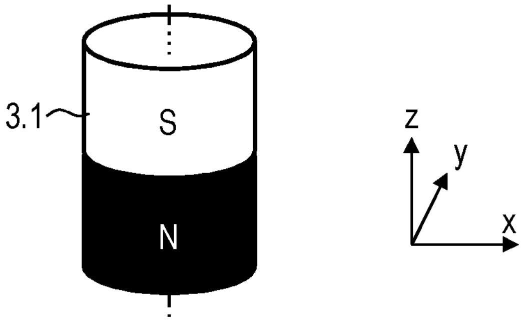
FIG. 3 a magnet of a magnet arrangement.

When a magnetic field moved relative to the domain wall conductor 1 acts appropriately on the domain wall conductor 1, domain walls W1, W2 will be displaced within the domain wall conductor 1 or along the domain wall conductor 1. To form a suitable magnetic field, a magnet arrangement 3 is used, which in the embodiment presented is configured as a magnet array consisting of a plurality of magnets 3.1 to 3.6. The magnet 3.1 is shown in FIG. 3 by way of example for all magnets 3.1 to 3.6. In the exemplary embodiment presented, all magnets 3.1 to 3.6 have an identical design. Accordingly, the magnets 3.1 to 3.6 are designed as cylindrical bodies, wherein the magnetic poles are arranged along the longest axis of symmetry in the sense of a bar magnet.

Figure 4:
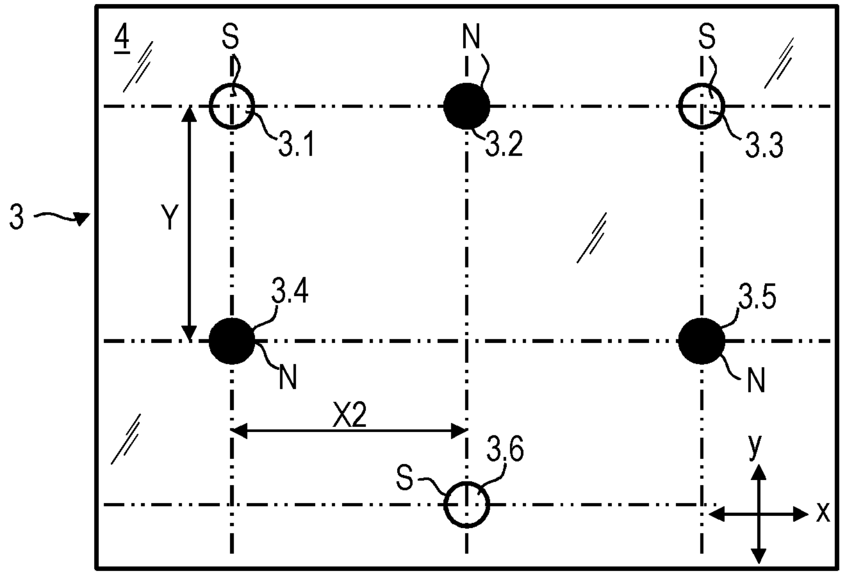
FIG. 4 a plan view of the magnet arrangement on a carrier plate.

FIG. 4 shows a corresponding magnet arrangement 3. Compared to the domain wall conductor 1 in FIG. 1 the magnet arrangement 3 is shown on a different scale. Magnets 3.1 to 3.6 are arranged in different north-south orientation on a carrier 4 according to a prespecified pattern. The magnets 3.1 to 3.6 can also be embedded in the carrier 4.

In particular, magnets 3.1 to 3.3 can be arranged adjacent to each other along the first direction x at a distance X2, wherein adjacent magnets 3.1 and 3.2 or 3.2 and 3.3 have an opposite pole orientation. Offset in a second direction y, further magnets 3.4 to 3.6 are lined up end to end in each case along the first direction x likewise at a distance X2. In the exemplary embodiment presented, the distance X2 is 0.33 mm. In the second direction y, the magnet 3.6 is offset relative to the remaining magnets 3.1 to 3.5.

A supporting magnetic field is provided in the direction x on both sides adjacent to the magnet arrangement 3. The magnetic fields can thus be represented in a simplified manner in FIG. 5, wherein the arrows with a very thick line to the left and right of the magnets 3.1 to 3.6 are intended to indicate the supporting magnetic field. It can be seen in FIG. 5 that the directions of the magnetic field lines change in such a way that turning or rotating magnetic field lines are produced, wherein the rotation of the magnetic field lines is present in each case about axes oriented in a third direction z (see FIG. 3).

The magnetic field generated by the magnet arrangement 3 is asymmetrical with respect to an axis Ax which runs parallel to the first direction x. There is, in particular, no axis running parallel to the first direction x which could represent an axis of symmetry. In contrast, the magnetic field generated by the magnet arrangement 3 is configured symmetrically with respect to an axis Ay which runs parallel to the second direction y, so that an axisymmetrical magnetic field is present with respect to the axis Ay.

Figure 5:
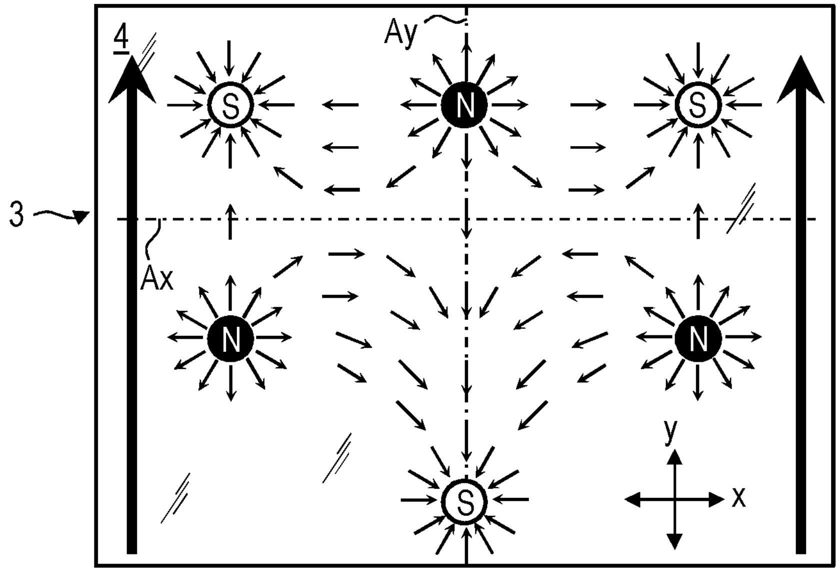
FIG. 5 a plan view of the magnet arrangement with a schematic representation of a magnetic field, FIG. 6 a side view of a scale element in accordance with a first exemplary embodiment, FIG. 7 a top view of the scale element and the sensor element in accordance with the first exemplary embodiment, FIG. 8 a schematic view of the sensor element and the magnet arrangement in a first relative position to each other, FIG. 9 a partial view of the domain wall conductor with domain walls marked in the first relative position, FIG. 10 a schematic view of the sensor element and of the magnet arrangement in a second relative position to each other, FIG. 11 a partial view of the domain wall conductor with domain walls marked in the second relative position, FIG. 12 a schematic view of the sensor element and of the magnet arrangement in a third relative position to each other, FIG. 13 a partial view of the domain wall conductor with domain walls marked in the third relative position, FIG. 14 a schematic view of the sensor element and of the magnet arrangement in a fourth relative position to each other, FIG. 15 a partial view of the domain wall conductor with domain walls marked in the fourth relative position, FIG. 16 a schematic view of the sensor element and of the magnet arrangement in a fifth relative position to each other, FIG. 17 a partial view of the domain wall conductor with domain walls marked in the fifth relative position, FIG. 18 a schematic view of the sensor element and of the magnet arrangement in a sixth relative position to each other, FIG. 19 a partial view of the domain wall conductor with domain walls marked in the sixth relative position, FIG. 20 a view of the domain wall conductor with domain walls marked in the further relative position during a second rotation, FIG. 21 a view of the domain wall conductor with domain walls marked in the further relative position after completed second rotation, FIG. 22 a view of the domain wall conductor with domain walls marked in the further relative position after completed third rotation, FIG. 23 a view of the domain wall conductor with domain walls marked in the further relative position after completed fourth rotation, FIG. 24 a view of a sensor element with a further domain wall conductor, FIG. 25 a plan view of the scale element according to a second exemplary embodiment, FIG. 26 a plan view of the scale element according to a third exemplary embodiment, FIG. 27 a plan view of a sensor element according to the fourth exemplary embodiment, FIG. 28 a plan view of a magnet arrangement according to a fourth exemplary embodiment, FIG. 29 a side view of the magnet arrangement with the sensor element according to the fourth exemplary embodiment.

As an alternative to the construction shown here, bar magnets can also lie in a plane which is oriented parallel to the first direction x and parallel to the second direction y, so that the north and south poles shown in FIG. 5 belong at least in part to one and the same magnet, in particular to magnets lying in the x-y plane.

Figure 6:
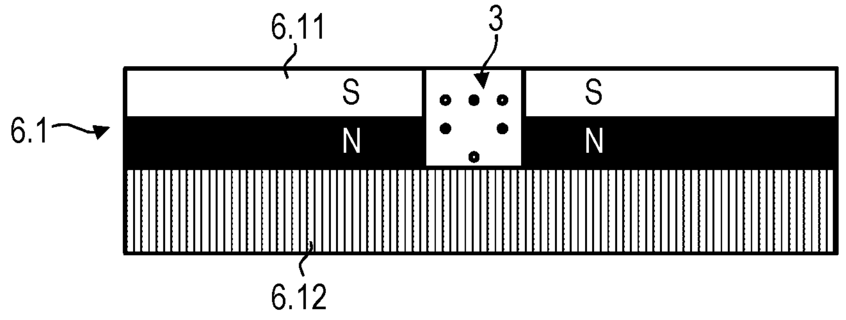
Figure 7:
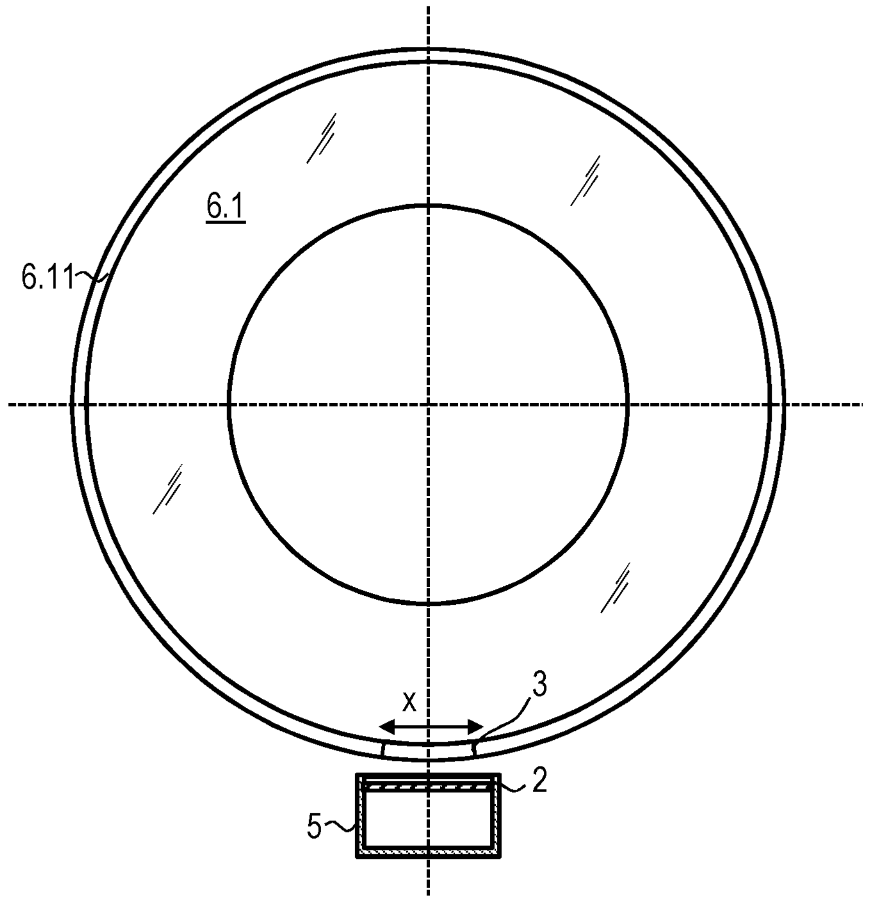

The magnet arrangement 3 is usually fixed to a scale element 6 or to a material measure. In the first exemplary embodiment according to FIGS. 6 and 7, the scale element 6 has a substantially annular drum 6.1 as the body. The magnet arrangement 3 consisting of magnets 3.1 to 3.6 and the carrier 4 is mounted on its external circumference. In addition, the drum 6.1 has a supporting magnet 6.11 in the region of the external circumference. This can consist, for example, of a layer of magnetizable material. The magnetization is carried out in such a way that north pole and south pole are arranged axially offset relative to each other. In the exemplary embodiment presented, a fine scale 6.12 is applied circumferentially on the drum 6.1 in the second direction y, that is to say, displaced in the axial direction relative to the supporting magnet. This can be decoded, for example, by an optical scanning device, which is likewise accommodated in the housing 5. Alternatively, the magnet arrangement 3 can also be arranged on the internal circumference of a drum or of a hollow shaft.

Opposite the radial air gap, the sensor element, that is to say, the domain wall conductor 1, is located with the substrate 2 within a housing 5. In the exemplary embodiment presented, the housing 5 is in a fixed position, while the drum 6.1 is rotatably mounted with the magnet arrangement 3 so that the magnet arrangement 3 moves in the first direction x (or contrary thereto) relative to the magnet arrangement 3 during rotation of the drum 6.1.

Figure 8:
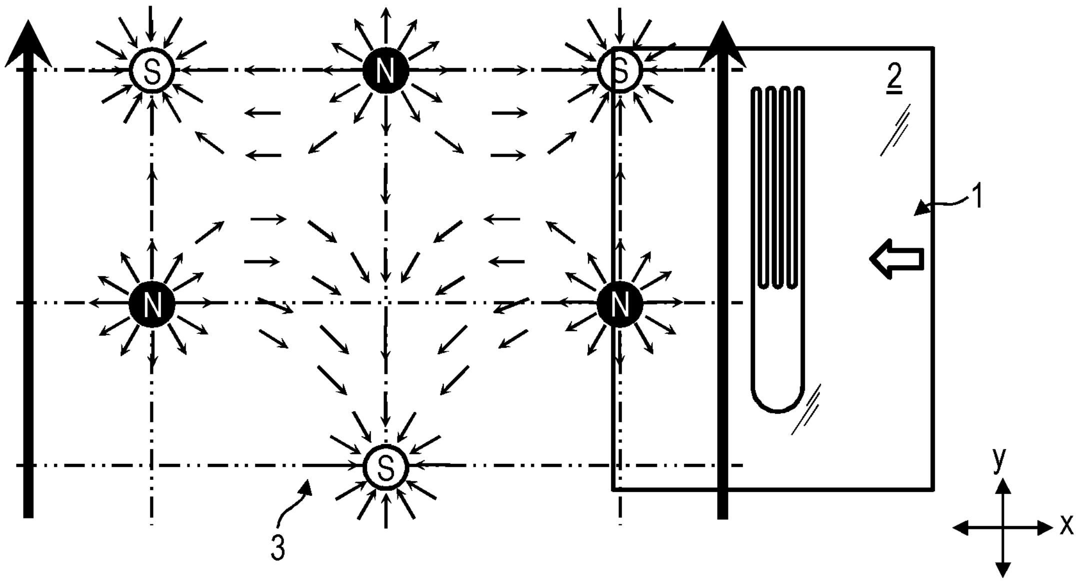
Figure 9:
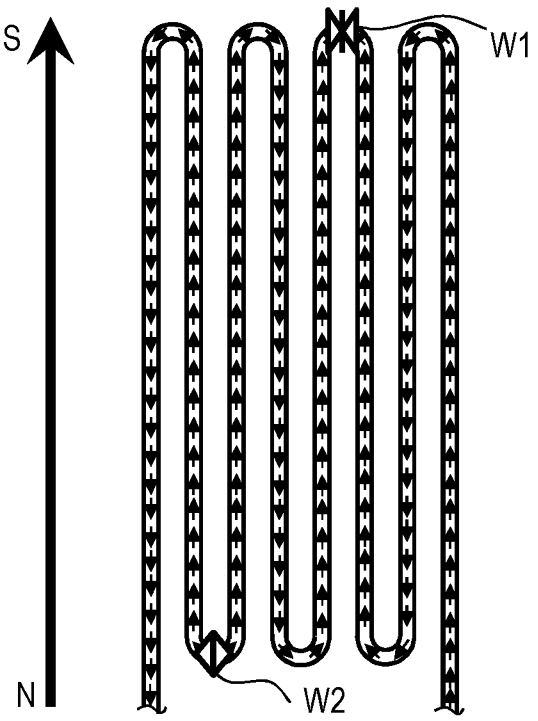

As a schematic diagram, FIG. 8 shows the magnet arrangement 3 and the domain wall conductor 1 in a first position relative to each other. In this position, domain walls W1, W2 are in the positions according to FIG. 9, wherein (as represented by the symbols) the first domain wall W1 is a so-called head-to-head domain wall and the second domain wall W2 is a so-called tail-to-tail domain wall. If the domain wall conductor 1 together with the substrate 2 moves relative to the magnet arrangement 3 in the first direction x according to the arrow in FIG. 8, the domain wall conductor 1 will be as to say guided by the rotating magnetic field, as shown in FIG. 5. As a result, the positions of domain walls W1, W2 will be displaced.

Figure 10:
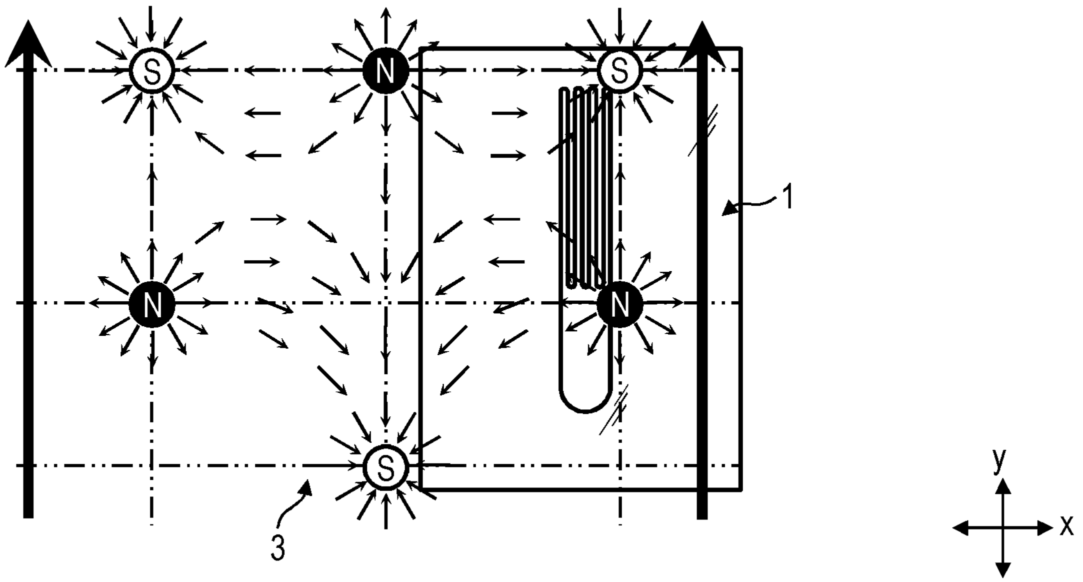
Figure 11:
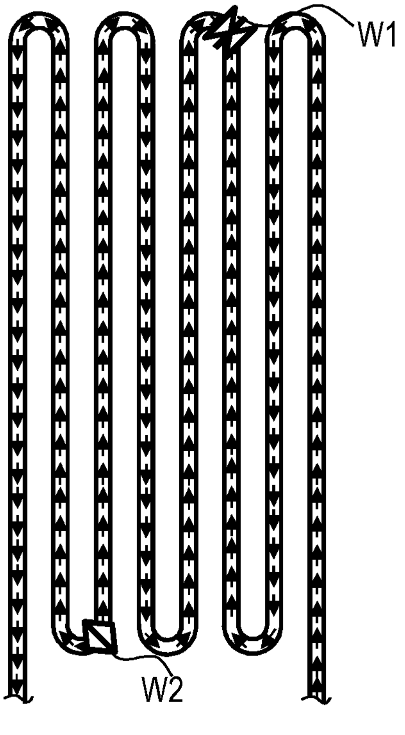
Figure 12:
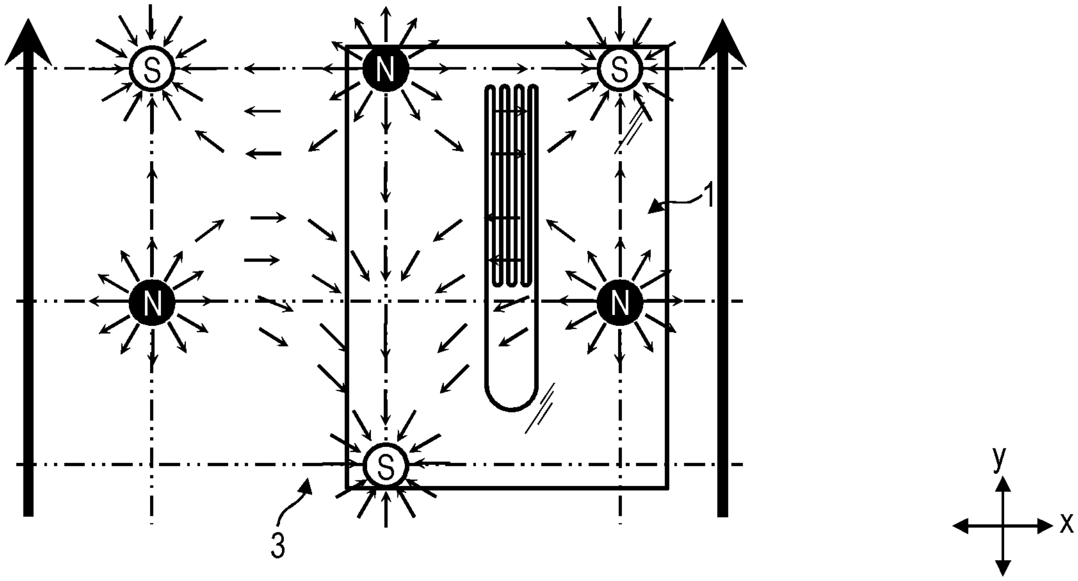
Figure 13:
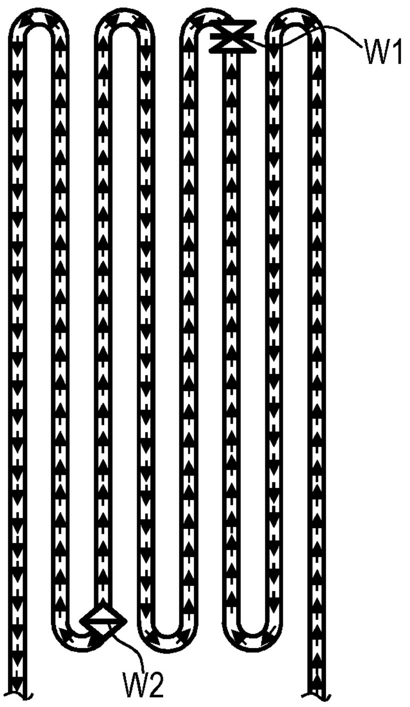
Figure 14:
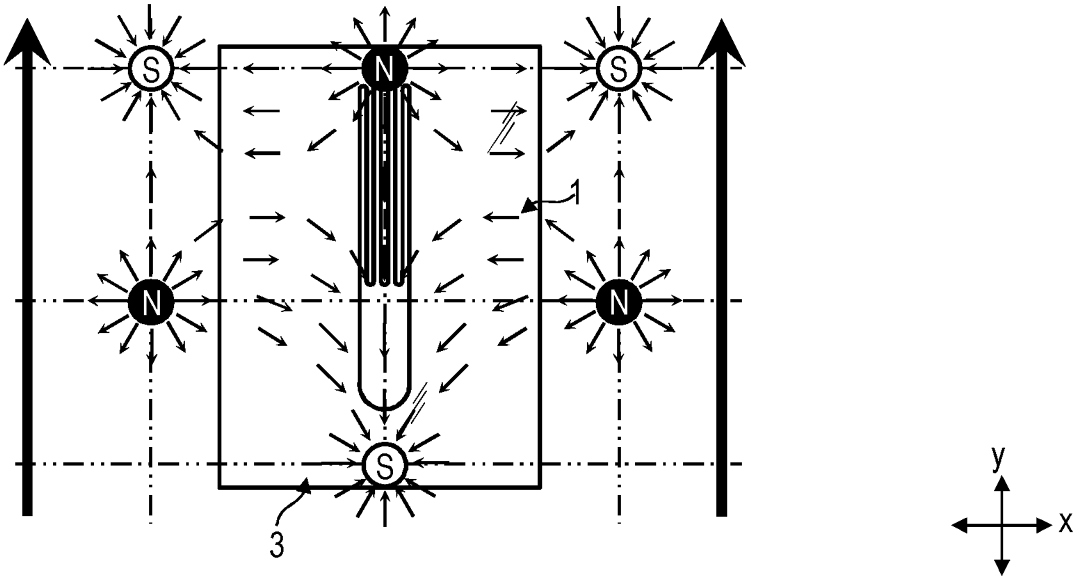
Figure 15:
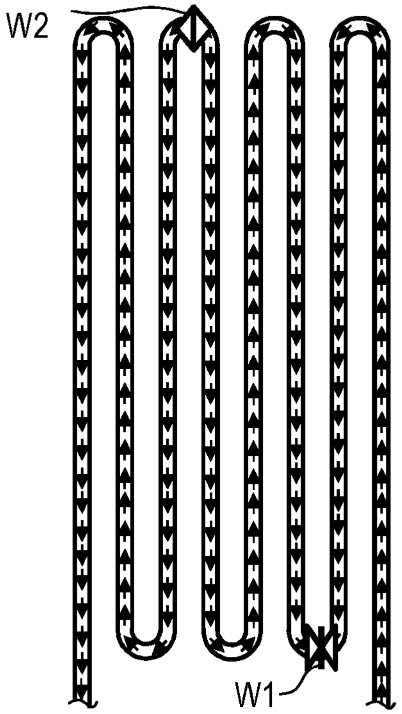
Figure 16:
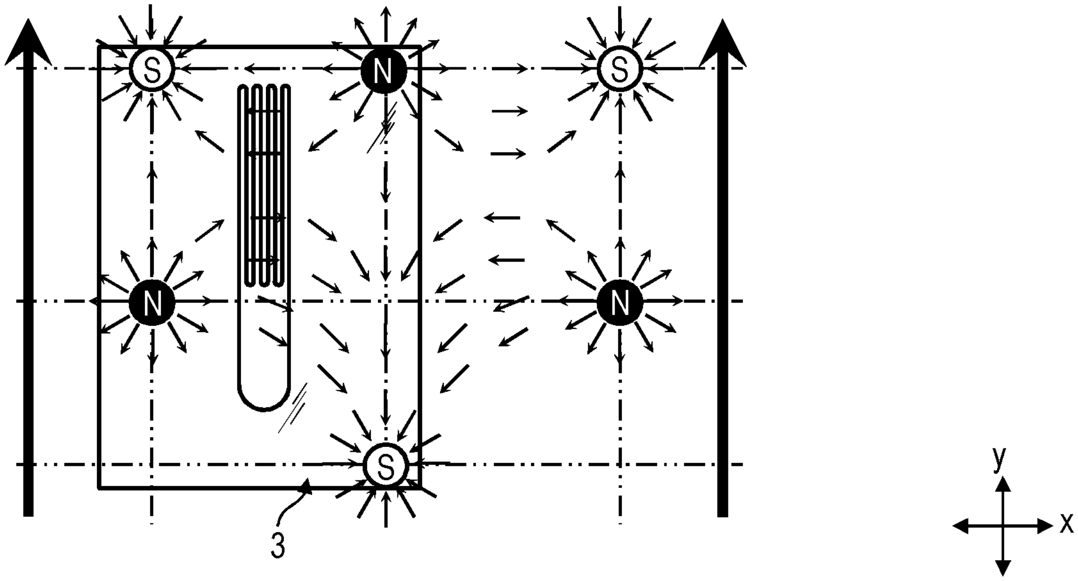
Figure 17:
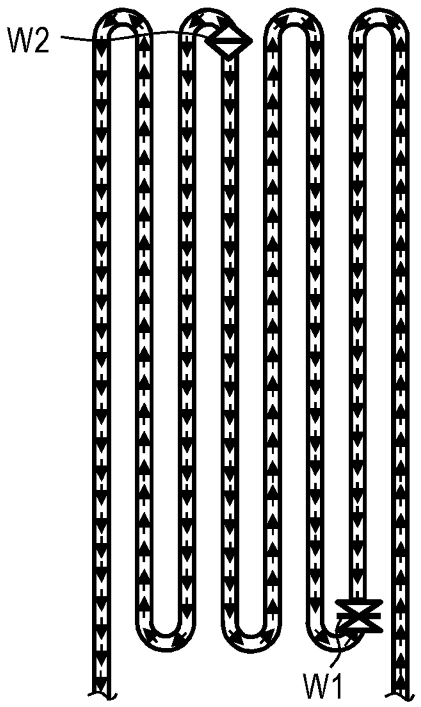

In FIG. 10 the domain wall conductor 1 is shown in a further position, wherein the magnetic field is rotated relative to the first position. Accordingly, domain walls W1, W2 have changed their positions (FIG. 11).

Analogously, as a result of a further displacement of the domain wall conductor 1 along the first direction x (FIGS. 12, 14, 16, 18), the positions of the domain walls W1, W2 are further displaced (FIGS. 13, 15, 17, 19). The positions of the domain walls W1, W2 in FIG. 19 include, for example, the information that the drum 6.1 has completed a first rotation.

In the event of a further movement or rotation in the same direction, the domain wall conductor 1 will remain in the influence of the supporting magnetic field, so that the positions of the domain walls W1, W2 then no longer change.

Figure 20:
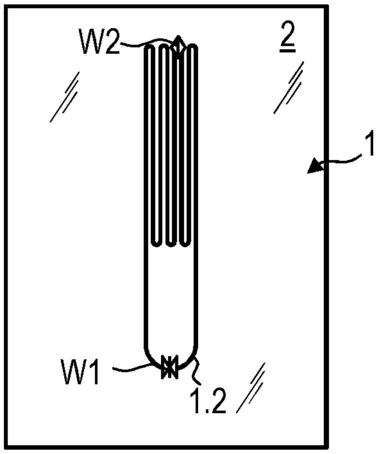
Figure 21:
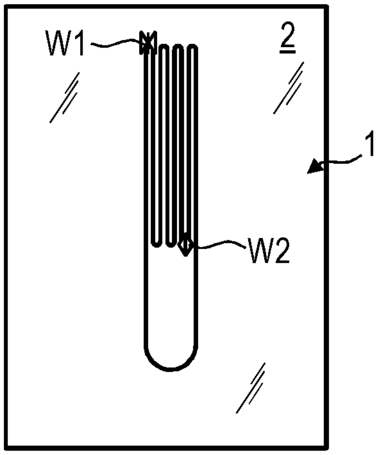

In the embodiment presented, the drum 6.1 is to rotate further in the same direction x so that the domain wall conductor 1 comes back into the magnetic sphere of influence of the magnet arrangement 3 in order to complete the second rotation. In FIG. 20, the positions of the domain walls W1, W2 are shown during the second rotation, wherein the domain wall conductor 1 with the substrate 2 is located in a position according to FIG. 14 (however, the drum 6.1 is then further rotated by 360°. A displacement of the domain walls W1, W2 over the length of the second section 1.2, in which the domain wall conductor 1 runs in an arc with a relatively large radius, is achieved in particular by the magnetic field of the magnet 3.6 offset in the second direction y or of the supporting field. At the end of the second rotation, when the domain wall conductor 1 is in a position according to FIG. 18 (relative to the situation in FIG. 18, the drum 6.1 is further rotated by 360°, the domain walls W1, W2 will have assumed positions according to FIG. 21.

Figure 22:
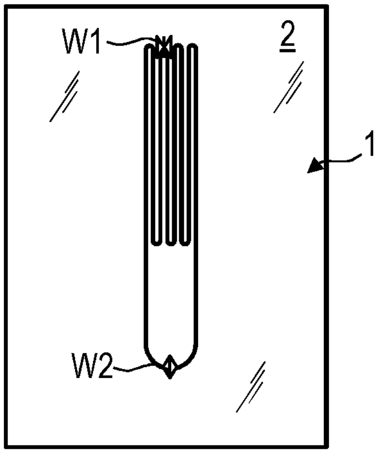

FIG. 22 shows the positions of the domain walls W1, W2 after a third rotation of the drum 6.1. In this state, the domain wall conductor 1 is in a position according to FIG. 18 (however, the drum 6.1 is then further rotated by 720°.

Figure 18:
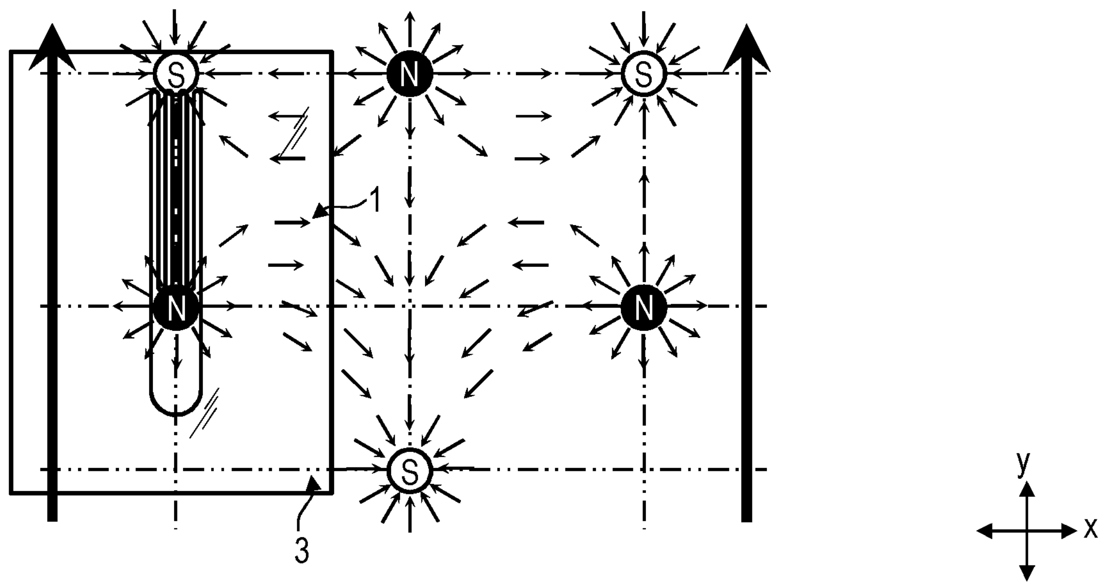
Figure 19:
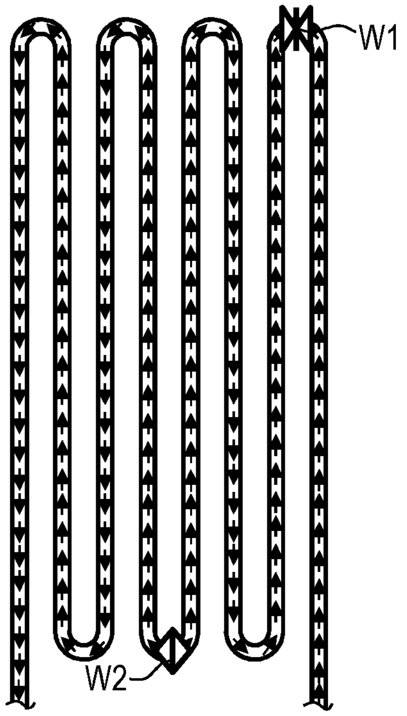
Figure 23:
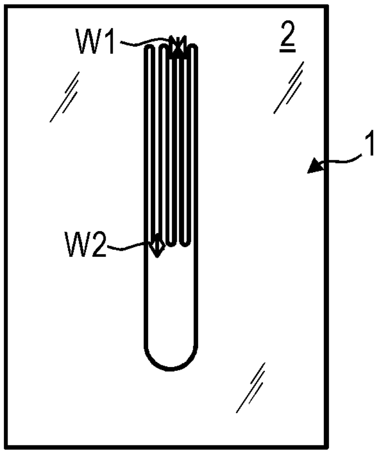

Consequently, the positions of the domain walls W1, W2 in FIG. 23 show that the drum 6.1 has completed a fourth rotation (position of the drum 6.1 is further rotated as in FIG. 18, but rotated by 1080°. The positions of the domain walls W1, W2 correspond to those of the initial state.

After each passing-by of the magnet arrangement 3 or after each rotation of the drum 6.1, the domain wall W1 will thus have moved further to an adjacent first region A of the domain wall conductor 1 in each case. Correspondingly, after each rotation, the domain wall W2 will have moved further to an adjacent second region B of the domain wall conductor 1 or be located in the second section 1.2 in which the domain wall conductor 1 runs in an arc with a relatively large radius.

The directions of magnetization within sections of the domain wall conductor 1 and thus the rough positions of the domain walls W1, W2 can be detected by the read-out elements 7. In this way, a count of rotations or storage of the rotation information is possible, even if no auxiliary energy is usable. This is important, for example, if, in the event of a power failure, a shaft is moved for instance by weight load. Other than that the domain walls W1, W2 are displaced depending on the direction of rotation, so that the sensor element can be used reliably in applications which permit both directions of rotation.

Figure 24:
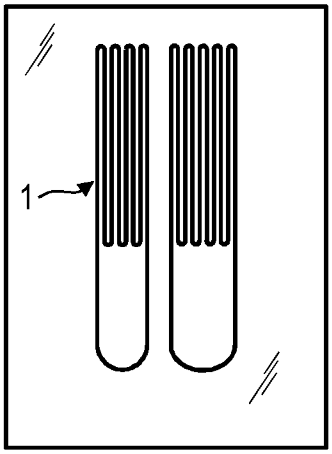

In order to increase the number of countable rotations, a plurality of domain wall conductors 1 may be provided, as is shown in simplified form in FIG. 24. In this case, it is advantageous if the plurality of domain wall conductors 1 have different numbers of first sections 1.1, in particular have different numbers of first regions A or have different numbers of second regions B. If a plurality of domain wall conductors 1 are used, it is advantageous if the numbers of the first regions A are in particular coprime. The plurality of domain wall conductors 1 can be offset relative to each other in the first direction x or interleaved with each other. In FIG. 24, the domain wall conductors are configured in such a way that they have four and five first regions A, wherein domain wall conductors with comparatively small numbers of first regions are shown in FIG. 24 for the sake of clarity. In practice, it is appropriate to use domain wall conductors with more than just four first regions. For example, four domain wall conductors can be used with 7, 9, 11, 13 first regions, so that 9009 (7×9×11×13) rotations would then be countable.

For the functioning of the storage system, it is important that, during the passing-by of the magnet arrangement 3 along the first direction x, a magnetic field is applied to the domain wall conductor 1, the direction of which changes as a function of the x position. In particular, turning or rotating magnetic field lines or magnetic field directions are present here during the passing-by. Magnetic field lines on one side of the axis Ax (FIG. 5) have an opposite sense of rotation during the passing-by (without change in direction) compared to magnetic field lines on the other side of the one axis Ax.

Figure 25:
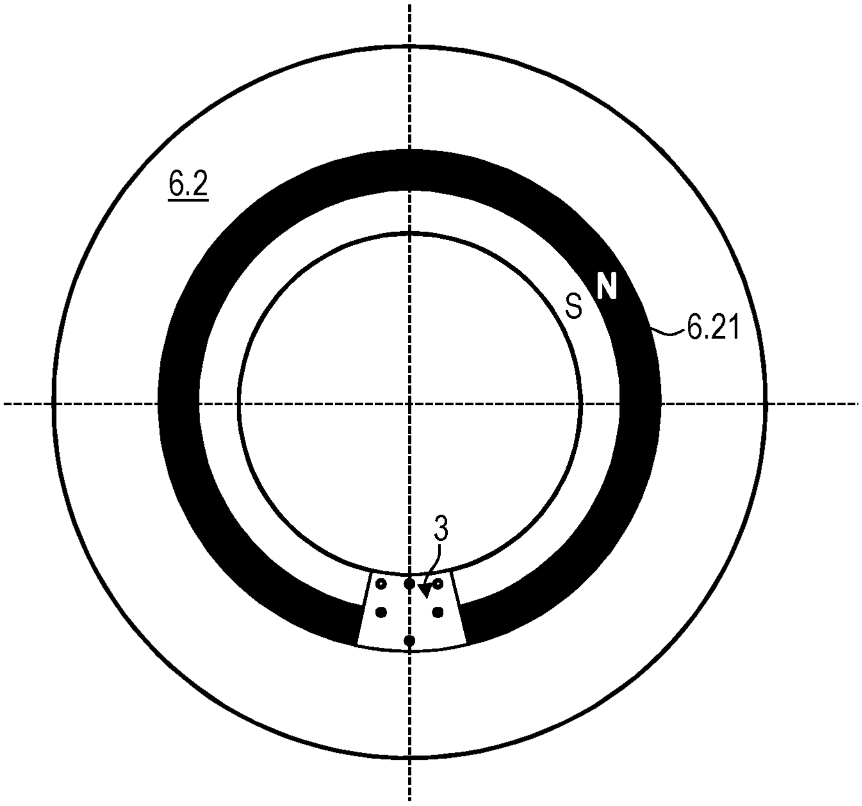

FIG. 25 shows a second exemplary embodiment. Here, the magnet arrangement 3 is fixed to an end face of a drum 6.2. The sensor element is arranged with an axial offset, that is to say, with an air gap which has an axial extent. With each passing-by of the magnet arrangement 3 at the sensor element the rotation information is updated, wherein domain walls W1, W2 are displaced as a function of the direction of rotation.

Figure 26:
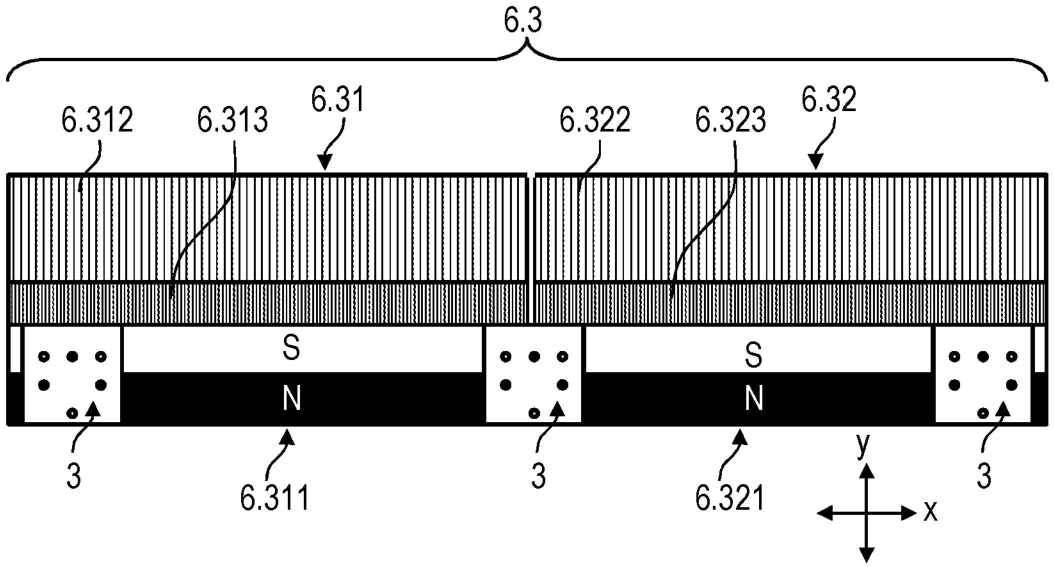

A third exemplary embodiment is explained with reference to FIG. 26. In this exemplary embodiment, the sensor element is used in connection with a linear scale 6.3. In the exemplary embodiment presented, this scale 6.3 comprises a first scale section 6.31 and a second scale section 6.32. The first scale section 6.31 and the second scale section 6.32 are lined up end to end along the first direction x, so that a comparatively large measuring length can be achieved. In practice, it is also perfectly possible for more than just two scale sections to be lined up end to end. The first scale section 6.31 comprises a supporting magnet 6.311 and the second scale section 6.32 comprises a supporting magnet 6.321. The magnet arrangements 3 are provided laterally in the first direction x offset in relation to the supporting magnets 6.311, 6.321. A scanning head has a sensor element with the domain wall conductor 1 and with a scanning device of an incremental track 6.313, 6.323 and of an absolute track 6.312, 6.322 (the incremental track 6.313, 6.323 and the absolute track 6.312, 6.322 extend over the two scale sections 6.31, 6.32). By means of the sensor element, it is possible to store position information so that it is possible to determine which of the scale sections 6.31, 6.32 is currently being scanned.

Figure 27:
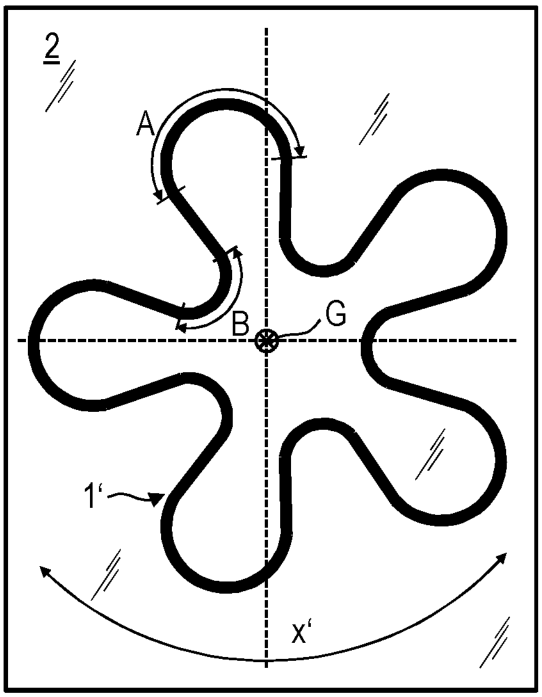
Figure 28:
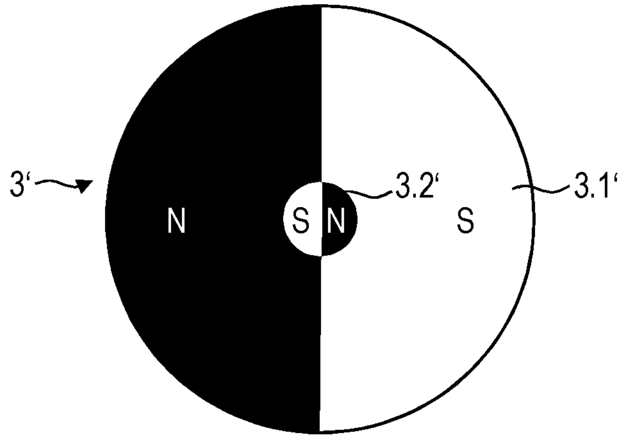
Figure 29:
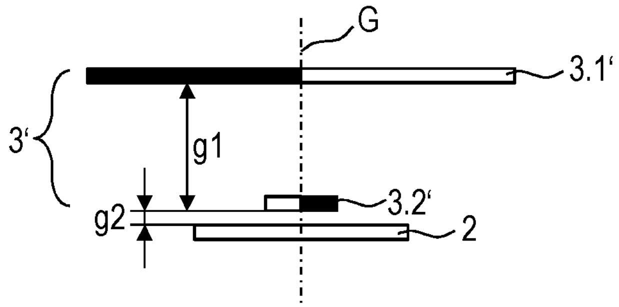

A fourth exemplary embodiment can be explained with reference to FIGS. 27 to 29. FIG. 27 shows a sensor element which has a domain wall conductor 1' which is modified with respect to the preceding exemplary embodiments and which runs around a central center of rotation (representation of read-out elements has been omitted in the figure). For displacing the domain walls, a magnet arrangement 3' is used, for example, which, as shown in FIG. 28, comprises two disk-shaped magnets 3.1', 3.2', which, in particular, have different diameters. The magnets 3.1', 3.2' have diametrical magnetization, so that the poles are arranged radially offset from one another. The magnets 3.1', 3.2' are arranged offset relative to one another along an axis G (that is to say axially), wherein their pole orientations are skewed 180° degrees with respect to the axis G. The magnets 3.1', 3.2' themselves are installed fixedly relative to one another in the corresponding storage system and thus cannot skew relative to each other or displace in any way relative to each other. As shown in FIG. 29, the distance g1 between the domain wall conductor 1' or the substrate 2, and the magnet 3.1' with the larger diameter is greater than the distance g2 between the domain wall conductor 1' or the substrate 2, and the magnet 3.2' with the smaller diameter (g1>g2). In this way, a magnetic field can be generated by means of which a suitable displacement of domain walls is achieved when the domain wall conductor 1' or the substrate 2 rotates about the axis G relative to the magnet arrangement 3' or moves along the first direction x' relative to the magnet arrangement 3'. It is thereby possible to count the number of rotations of the substrate 2 relative to the magnet arrangement 3'.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A sensor element for storing rotation or position information, the sensor element comprising:
- a substrate; and
- a domain wall conductor arranged on the substrate, a course of the domain wall conductor being of a closed circumferential, continuous configuration without crossings, and the domain wall conductor comprising a first region having a positive curvature and a second region having a negative curvature.

2. The sensor element according to claim 1, wherein the domain wall conductor is configured as a conductor track on the substrate.

3. The sensor element according to claim 1, wherein a width of the domain wall conductor is less than 1000 nm.

4. The sensor element according to claim 1, wherein the substrate comprises a glass layer and/or a silicon layer.

5. The sensor element according to claim 1, further comprising read-out elements by which a local magnetization state of the domain wall conductor is determinable.

6. The sensor element according to claim 5, wherein the domain wall conductor (is arranged in a layer between at least one of the read-out elements and the substrate.

7. The sensor element according to claim 5, wherein at least one of the read-out elements is arranged in a layer between the substrate and the domain wall conductor.

8. The sensor element according to claim 5, wherein the read-out elements are configured as giant magnetoresistance (GMR) or tunnel magnetoresistance (TMR) sensors.

9. The sensor element according to claim 1, wherein the sensor element has a plurality of domain wall conductors which have different numbers of first regions or different numbers of second regions.

10. The sensor element according to claim 9, wherein the different numbers of first regions are coprime.

11. A storage system comprising the sensor element according to claim 5 and a magnet arrangement which is movable in a first direction relative to the domain wall conductor.

12. The storage system according to claim 11, wherein the magnet arrangement is configured as a magnet array comprising magnets having poles that are arranged offset from each other in the first direction.

13. The storage system according to claim 11, wherein the magnet array comprises magnets having poles that are arranged offset from each other in a second direction, the second direction being oriented orthogonally to the first direction.

14. The storage system according to claim 11, wherein, in the first direction, the domain wall conductor has an extent and two magnetic poles of the magnet arrangement have a center distance from each other, wherein the extent is less than the center distance.

15. The storage system according to claim 11, wherein, in relation to the first direction, a supporting magnet is arranged in addition to the magnet arrangement.

* * * * *